US009173309B2

(12) United States Patent
Chen et al.

(10) Patent No.: US 9,173,309 B2
(45) Date of Patent: Oct. 27, 2015

(54) ELECTRONIC DEVICE ENCLOSURE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Guo-Yi Chen, Shenzhen (CN); Ming-Yu Liu, Shenzhen (CN); An-Gang Liang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 266 days.

(21) Appl. No.: 13/864,271

(22) Filed: Apr. 17, 2013

(65) Prior Publication Data

US 2014/0251678 A1    Sep. 11, 2014

(30) Foreign Application Priority Data

Mar. 7, 2013    (CN) .......................... 2013 1 0072795

(51) Int. Cl.
| | |
|---|---|
| H05K 7/16 | (2006.01) |
| G06F 1/16 | (2006.01) |
| H05K 5/02 | (2006.01) |
| H02G 3/14 | (2006.01) |
| G06F 1/18 | (2006.01) |
| H05K 5/03 | (2006.01) |
| H05K 7/14 | (2006.01) |
| H05K 5/00 | (2006.01) |
| H05K 7/18 | (2006.01) |

(52) U.S. Cl.
CPC ............ H05K 5/0221 (2013.01); G06F 1/1679 (2013.01); G06F 1/181 (2013.01); H02G 3/14 (2013.01); H05K 5/03 (2013.01); H05K 7/1487 (2013.01)

(58) Field of Classification Search
CPC ......... G06F 1/181; G06F 1/1679; H05K 5/03; H05K 5/0221; H02G 3/14
USPC ............. 361/679.01, 679.02, 679.27, 679.28, 361/679.57, 679.58, 616, 726, 732, 759, 361/801; 174/50, 50.51, 66, 67
See application file for complete search history.

(56) References Cited

U.S. PATENT DOCUMENTS

2011/0043973 A1*   2/2011   Tai ........................... 361/679.01

* cited by examiner

*Primary Examiner* — Hoa C Nguyen
*Assistant Examiner* — Binh Tran
(74) *Attorney, Agent, or Firm* — Novak Druce Connolly Bove + Quigg LLP

(57) ABSTRACT

An electronic device enclosure includes a chassis defining an space, and a cover module. The chassis includes two opposite sidewalls locating at two sides of the space. The cover module includes a cover and a latching apparatus mounted to the cover. A first end of the cover is rotatably connected to first ends of the sidewalls, and the latching apparatus is mounted to a second end of the cover. A second end of one of the sidewalls defines a latching hole. The latching apparatus includes a latching member slidably mounted to the cover, a resilient member sandwiched between the latching member and the cover, and an operation member mounted to the latching member. The latching member includes a latching block. The resilient member biases the latching member to slide, to allow the latching block to latch in the latching hole.

16 Claims, 9 Drawing Sheets

ELECTRONIC DEVICE ENCLOSURE

BACKGROUND

1. Technical Field

The present disclosure relates to an electronic device enclosure having a detachable cover.

2. Description of Related Art

Some electronic device enclosures include a chassis and a cover. The chassis holds components, such as a motherboard, interface cards, a power supply, and hard disk drives. A space is defined in the chassis. The cover is attached to the chassis with screws to cover the space. However, securing the cover to the chassis with screws is unduly complicated and time consuming.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
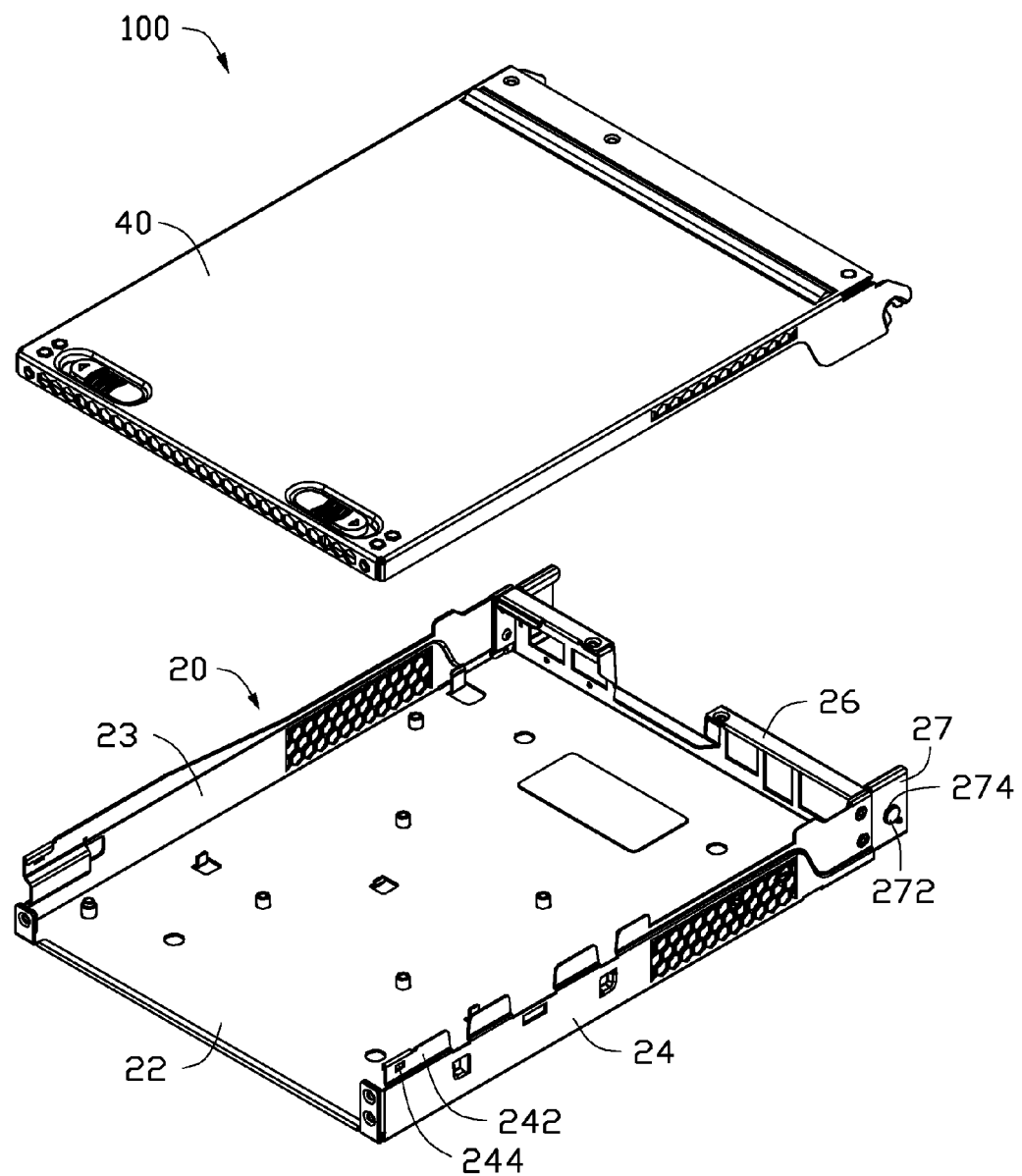
FIG. 1 is an exploded, isometric view of an embodiment of an electronic device enclosure, wherein the electronic device enclosure includes a cover module.

FIG. 1 shows an embodiment of an electronic device enclosure 100 including a chassis 20 and a cover module 40.

The chassis 20 includes a rectangular bottom wall 22, two sidewalls 24 extending up from two opposite sides of the bottom wall 22 in a substantially perpendicular manner, and an end wall 26 perpendicularly extending up from an end of the bottom wall 22 and connected between the sidewalls 24. Top sides of the bottom wall 22, the sidewalls 24, and the end wall 26 cooperatively bound a space 23. Two connecting plates 27 perpendicularly extend out from two opposite ends of the end wall 26. Two opposite shafts 272 perpendicularly extend out from middles of the connecting plates 27. Each shaft 272 is substantially T-shaped, and a space 274 is formed between each shaft 272 and the corresponding connecting plate 27. A substantially L-shaped flange 242 extends in and then up from the top side of each sidewall 24. Each flange 242 defines a latching hole 244 away from the end wall 26. In the embodiment, the electronic device enclosure 100 is a server enclosure.

Figure 2:
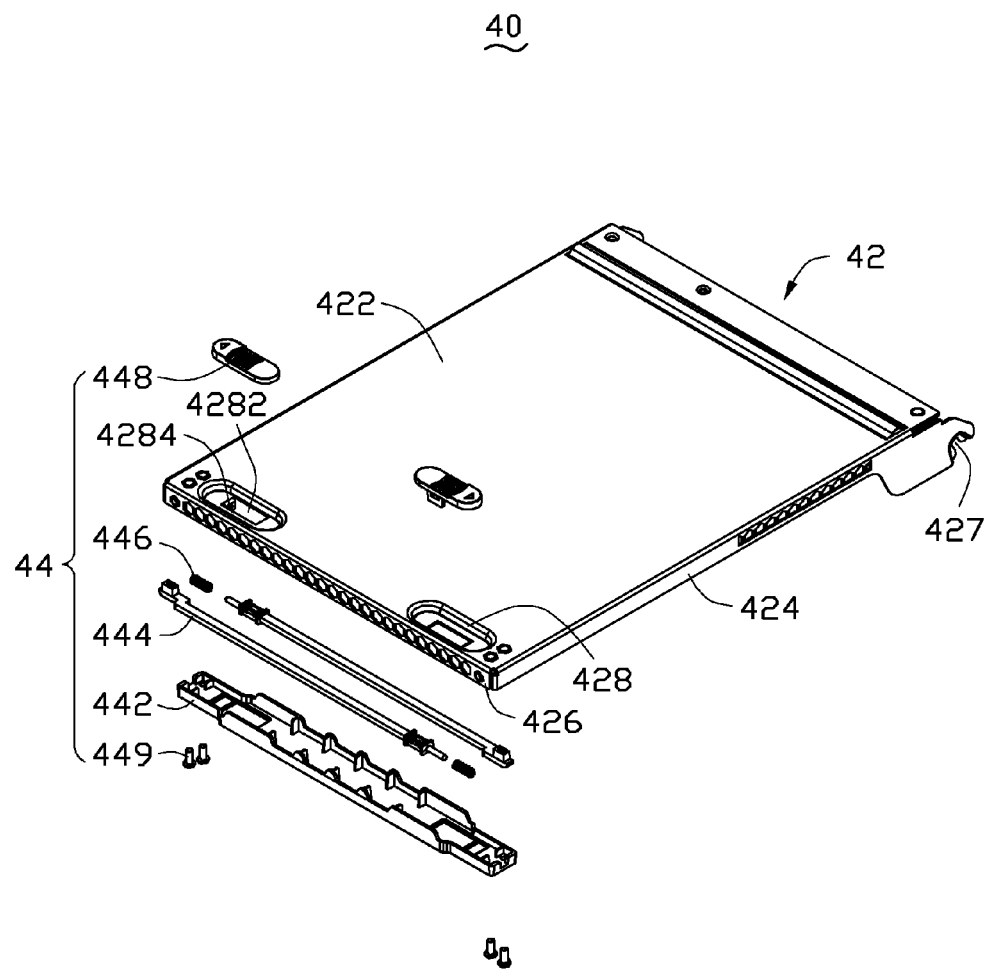
FIG. 2 is an exploded, isometric view of the cover module of FIG. 1.
Figure 3:
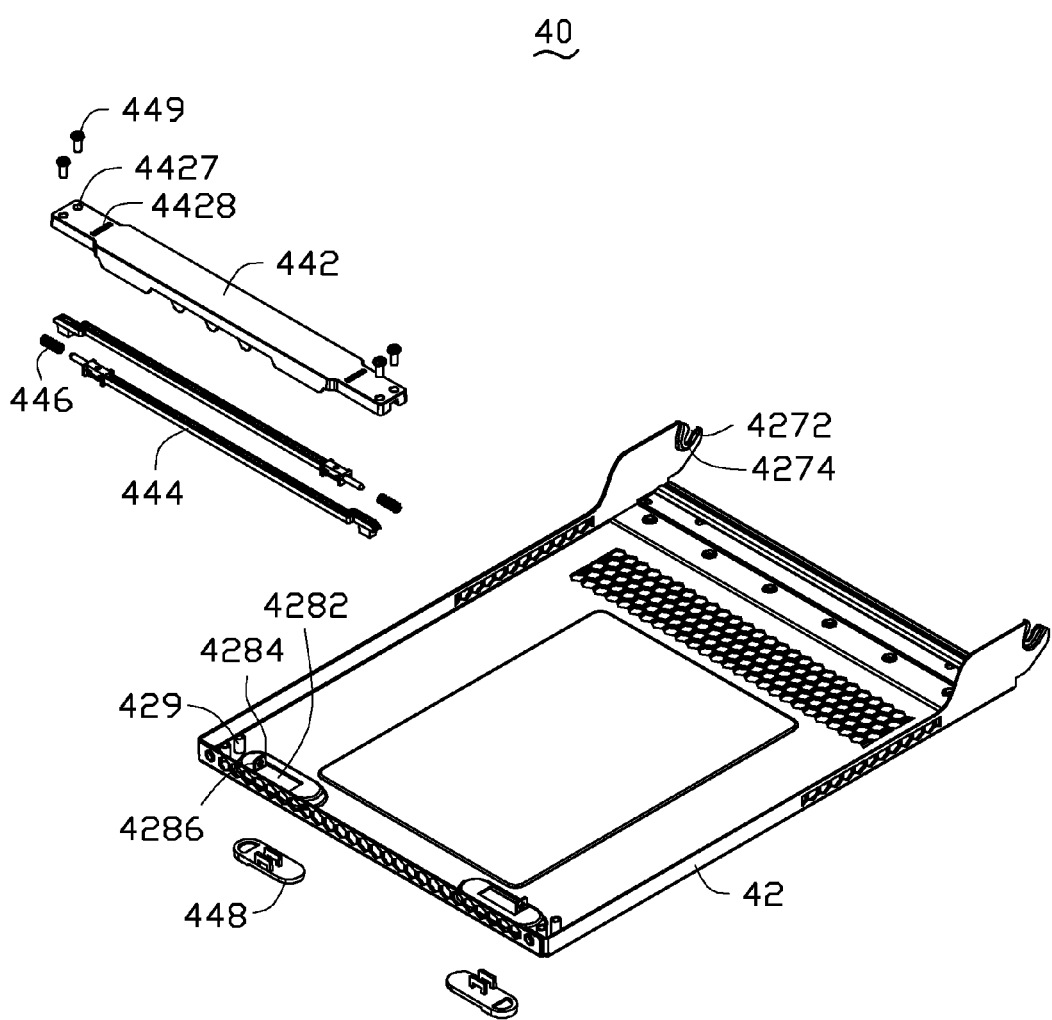
FIG. 3 is an inverted view of the cover module of FIG. 2.
Figure 4:
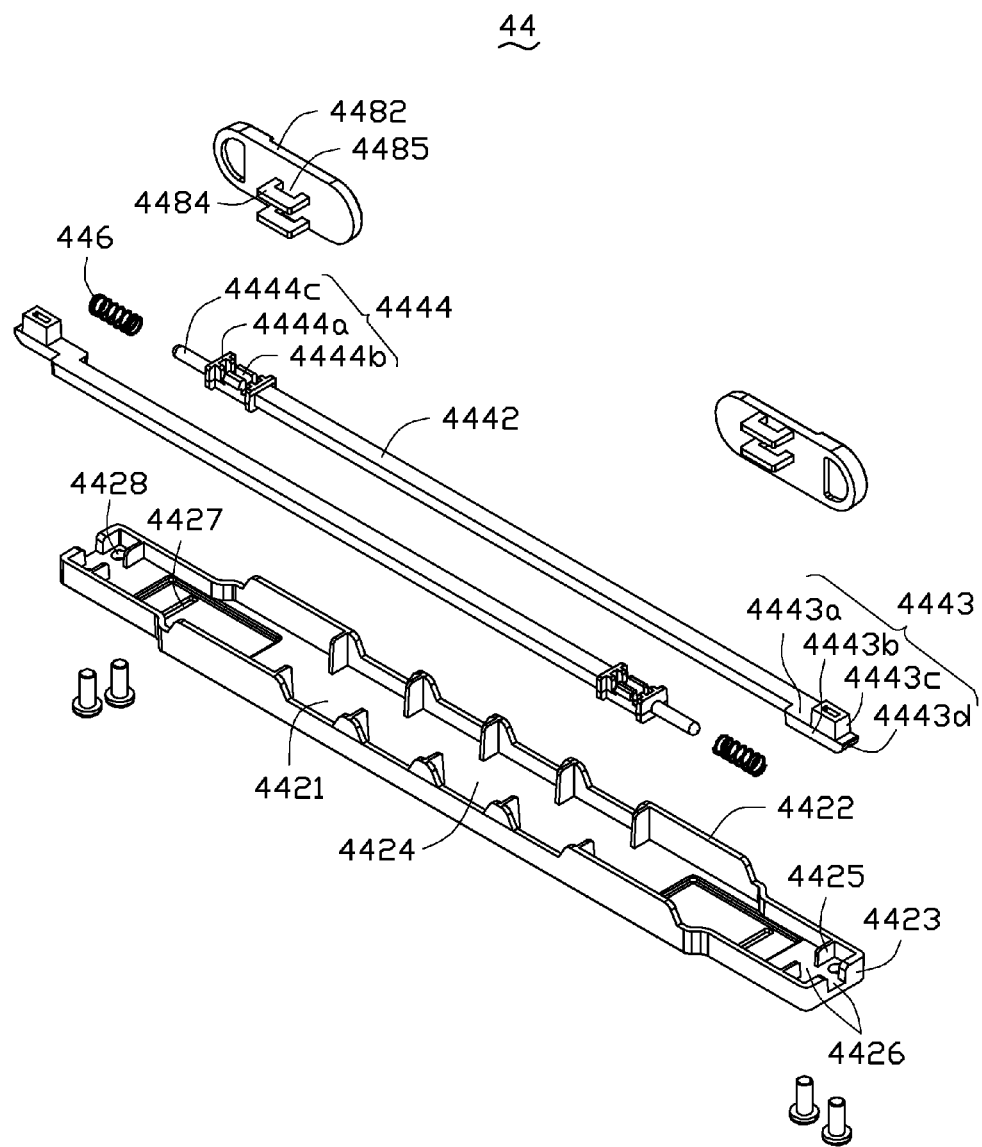
FIG. 4 is a partial, enlarged view of the cover module of FIG. 2.

FIGS. 2-4 show the cover module 40 including a cover 42 and a latching apparatus 44.

The cover 42 includes a rectangular panel 422, two side plates 424 extending down from two opposite sides of the panel 422 in a substantially perpendicular manner, and an end plate 426 perpendicularly extending down from a first end of the panel 422 and connected between the side plates 424. Second ends of the side plates 424 away from the end plate 426 define two opposite cutouts 427. Each cutout 427 includes an access hole 4272 extending through a bottom side of the side plate 424 and a rotation hole 4274 communicating with the access hole 4272. Two indentations 428 are depressed down from the first end of the panel 422, respectively adjacent to the side plates 424. Each indentation 428 extends along a direction parallel to the end plate 426. A bottom plate of each indentation 428 defines a rectangular slide slot 4282 extending along a lengthwise direction of the indentation 428. A position piece 4284 perpendicularly extends down from an end edge bounding each slide slot 4282 and adjacent to the corresponding side plate 424. Each position piece 4284 defines a through hole 4286. Two connecting poles 429 perpendicularly extend down from the panel 422, between each position piece 4284 and the corresponding side plate 424. Each connecting pole 429 axially defines a screw hole.

The latching apparatus 44 includes a bracket 442, two latching members 444, two resilient members 446, two operation members 448, and a plurality of screws 449.

The bracket 442 includes a bar-shaped bottom plate 4421, two side plates 4422 perpendicularly extending up from two opposite sides of the bottom plate 4421, two end plates 4423 perpendicularly extending up from two opposite ends of the bottom plate 4421 and connected between the side plates 4422. The bottom plate 4421, the side plates 4422 and the end plates 4423 cooperatively bound a receiving space 4424. Two engaging pieces 4425 extend into the receiving space 4424 from the ends of the bottom plate 4421. Each end plate 4423 and the corresponding engaging piece 4425 define two opposite cutouts 4426. Each end of the bottom plate 4421 defines two through holes 4428 between the end plate 4423 and the engaging piece 4425, and a slot 4427 at a side of the engaging piece 4425 opposite to the through holes 4428.

Each latching member 444 includes a slide bar 4442, a latching portion 4443 formed on a first end of the slide bar 4442, and a connecting portion 4444 formed on a second end of the slide bar 4442 opposite to the latching portion 4443. The latching portion 4443 includes an engaging block 4443a perpendicularly extending out from the slide bar 4442, a bar-shaped latching block 4443b perpendicularly extending from a distal end of the engaging block 4443a along a lengthwise direction of the slide bar, and a raised block 4443c perpendicularly extending up from a middle of the latching block 4443b. A distal end of the latching block 4443b defines a slanted guiding surface 4443d. The connecting portion 4444 includes a substantially U-shaped shell 4444a protruding out from the slide bar 4442, two opposite resilient hooks 4444b extending up from the shell 4444a, and a pin 4444c extending out from an end of the shell 4444a opposite to the slide bar 4442 and along the lengthwise direction of the slide bar 4442.

In one embodiment, each resilient member 446 is a coil spring.

Each operation member 448 includes an operation plate 4482 and two spaced and parallel extending pieces 4484 perpendicularly extending down from the operation plate 4482. The extending pieces 4484 define two opposite latching holes 4485 adjacent to the operation plate 4482. A top surface of the operation plate 4482 defines a plurality of anti-skid strips.

Figure 5:
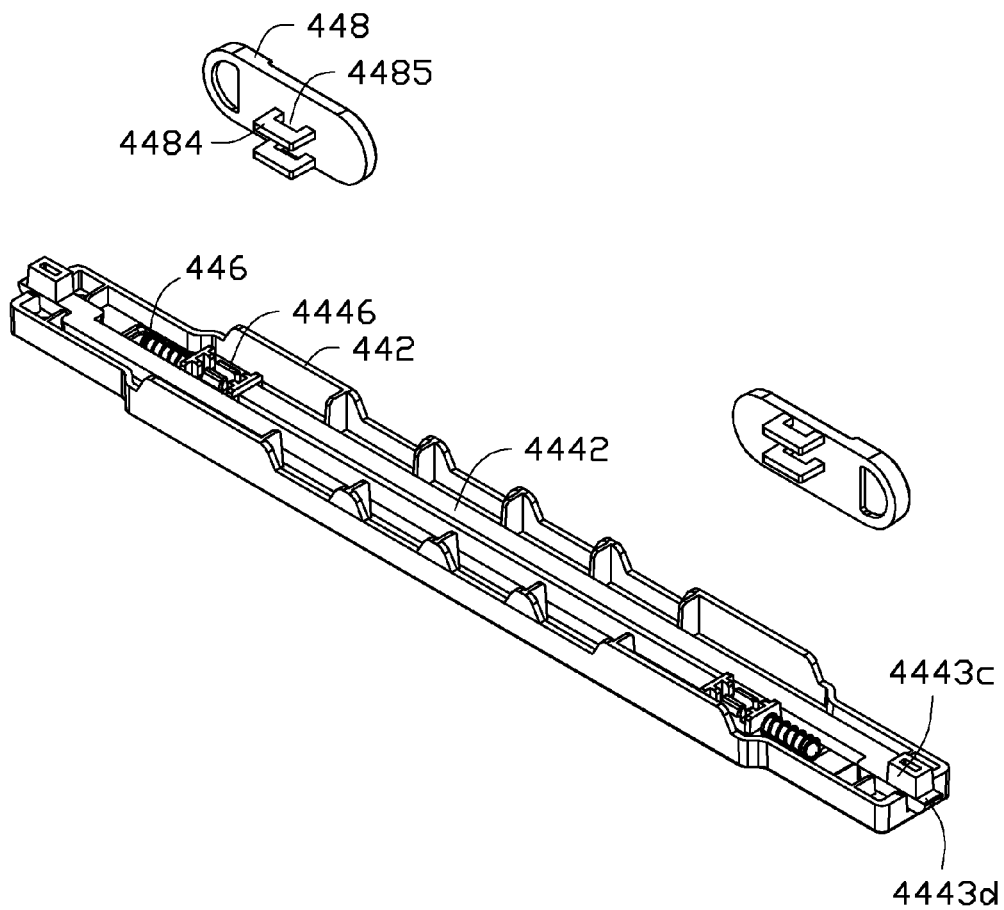
FIG. 5 is a partially assembled, isometric view of the cover module of FIG. 4.
Figure 6:
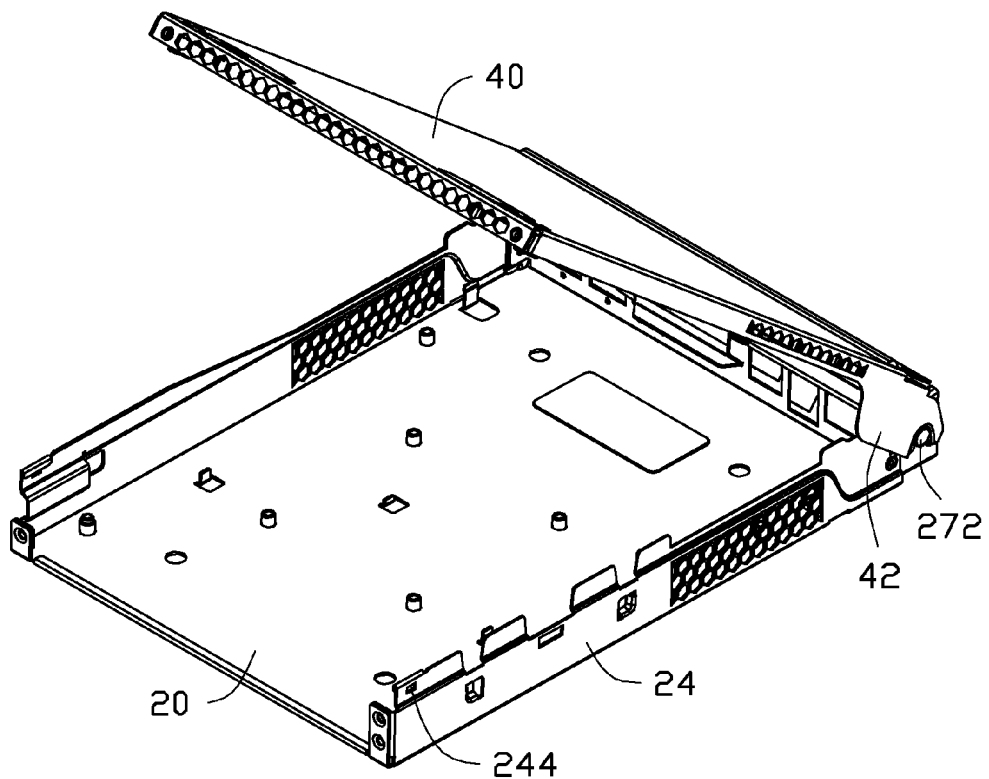
FIGS. 6-9 are views showing the processes of assembling the electronic device enclosure of FIG. 1.
Figure 7:
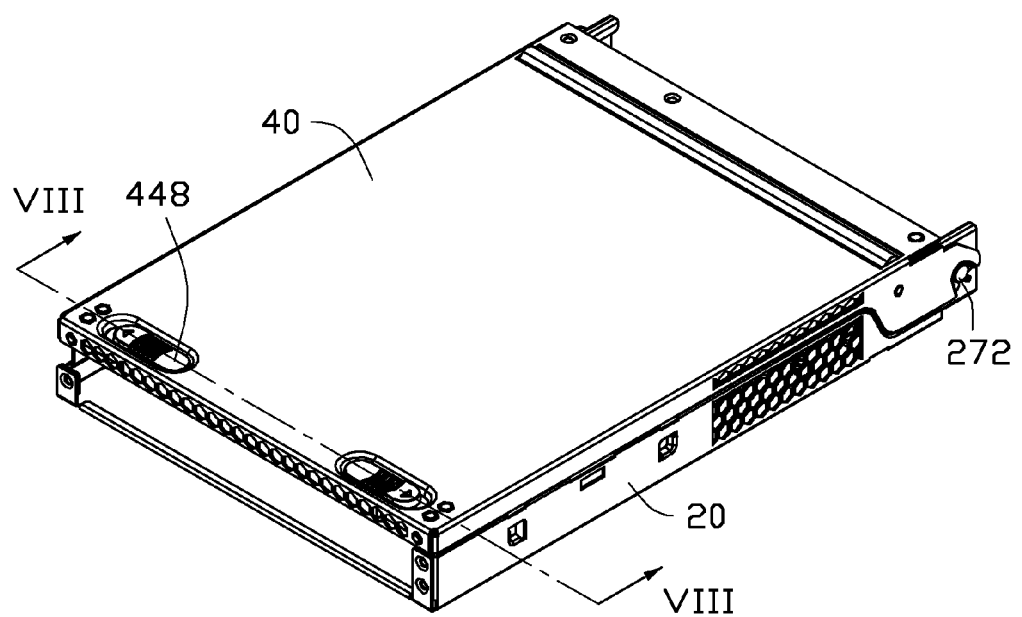
Figure 8:
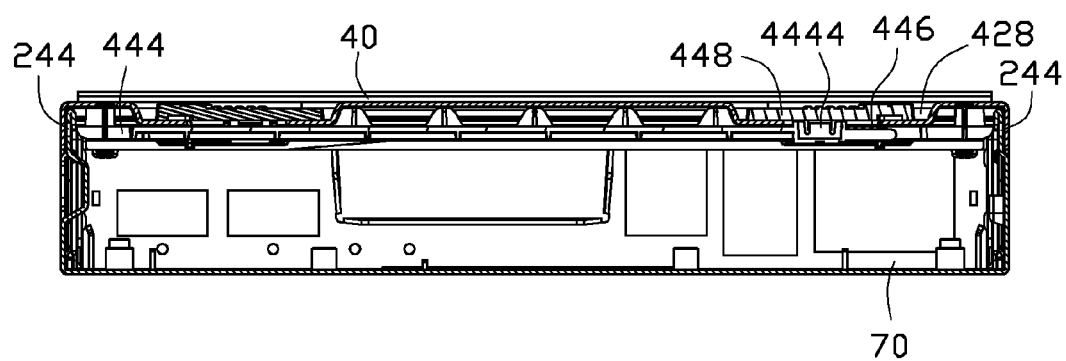
Figure 9:
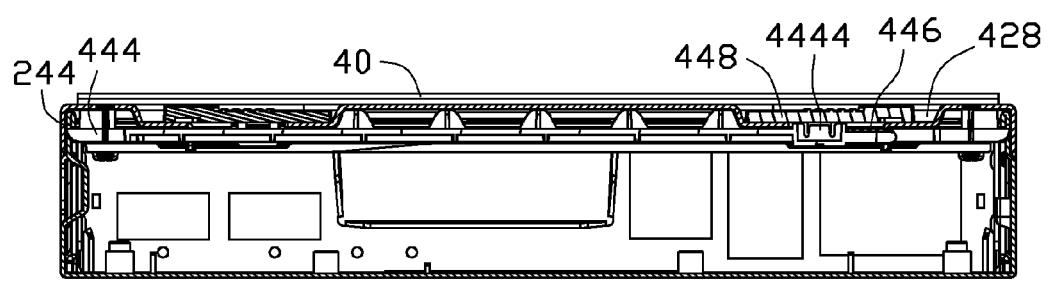

FIG. 5 shows that in assembly of the cover module 40, the resilient members 446 are fitted about the pins 4444c of the latching members 444. The latching members 444 are attached to a bottom surface of the panel 422, between the position pieces 4284. The pins 4444c of the latching members 446 are inserted into the through holes 4286 of the position pieces 4284, with the hooks 4444b of the connecting portions 4444 aligning with the slide slots 4282. The bracket 442 is attached to the bottom surface of the panel 422, to allow the latching members 444 to be received in the receiving space 4424. The position pieces 4284 are inserted into the slots 4427 of the bracket 442, the latching blocks 4443b are slidably received in the cutouts 4426 of the bracket 442, and each resilient member 446 is resiliently sandwiched between the shell 4444a and the corresponding position piece 4284. A plurality of screws extends through the through holes 4428 of the bracket 442 from a bottom of the bracket 442, to be screwed into the screw holes of the connecting poles 429. The extending pieces 4484 of the operation members 448 are inserted into the slide slots 4282 of the panel 422, and the hooks 4444b slidably abut against the corresponding extending pieces 4484, deforming the hooks 4444b, until each hook 4444b aligns with the corresponding latching hole 4485. The hooks 4444b are restored to latch into the latching holes 4485. The operation members 448 are slidably received in the indentations 428 of the cover 42, along the slide slots 4282. Thus, the resilient members 446 bias the latching members 444 to move with the blocks 443c moving toward the adjacent side plates 424, until the engaging blocks 4443a are stopped by the corresponding engaging pieces 4425, and the distal end of the latching blocks 4443b extend beyond the corresponding end plates 4423.

FIGS. 6-9 show that in use, the bracket 442 of the cover 42 is facing the space 23 of the chassis 20, and the panel 422 is covering the space 23. The shafts 272 are inserted into the rotation holes 4274 through the corresponding access holes 4272. The cover 42 is rotated down about the shafts 272. The guiding surfaces 4443d of the latching members 444 are slidably abutted against the flanges 242. The latching members 444 are slid away from the corresponding flanges 242, deforming the resilient members 446, until the latching blocks 4443b align with the latching holes 244. The resilient members 446 are restored to bias the latching blocks 4443b to latch into the latching holes 244 of the chassis 20. The raised blocks 4443c are stopped by inner surfaces of the corresponding flanges 242. Thus, the cover module 40 is mounted to the chassis 20, and the space 23 is covered by the panel 422.

To detach the cover module 40 from the chassis 20, the operation members 448 are moved away from each other through the fingers of a user operating the anti-skid strips of the operation member 448. The latching blocks 4443b move away from the corresponding flanges 242, deforming the resilient members 446. The latching blocks 4443b are detached from the latching holes 244. The cover module 40 is rotated away from the chassis 20 about the shafts 272, and the cover module 40 can now be readily removed from the chassis 20.

While the disclosure describes examples and embodiments, it is to be understood that the disclosure is not limited thereto. On the contrary, the disclosure is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electronic device enclosure, comprising:
a chassis defining a space, and comprising two opposite sidewalls locating at two opposite sides of the space; and
a cover module comprising a cover and a latching apparatus mounted to the cover;
wherein a first end of the cover is rotatably connected to first ends of the sidewalls, and the latching apparatus is mounted to a second end of the cover, a second end of one of the sidewalls defines a latching hole, the latching apparatus comprises a latching member slidably mounted to the cover, a resilient member sandwiched between the latching member and the cover, and an operation member mounted to the latching member, the latching member comprises a latching block, the resilient member biases the latching member to slide to allow the latching block to latch in the latching hole; when the operation member is moved toward the other sidewall of the chassis, deforming the resilient member, until the latching block is detached from the latching hole;
wherein two opposite shafts protrude out from the first ends of the sidewalls, the cover comprises a panel detachably covered to the space and two first side plates extending down from two opposite sides of the panel, first ends of the side plates defines two opposite cutouts, the shafts are rotatably received in the cutouts; and
wherein the chassis further comprises an end wall connected between the first ends of the sidewalls, and two connecting plates extending out from two ends of the end wall, the shafts protrude out from the connecting plates, the latching hole is located away from the shafts, the cover further comprises a first end plate connected between second ends of the first side plates opposite to the cutouts, the latching apparatus is installed to the panel adjacent to the first end plate.

2. The electronic device enclosure of claim 1, wherein the panel defines a slide slot adjacent to the first end plate, the slide slot extends along a direction parallel to the first end plate, the latching member comprises a slide bar, a connecting portion formed on a first end of the slide bar and aligning with the slide slot, and a latching portion formed on a second end of the slide bar opposite to the connecting portion, the latching block protrudes out from the latching portion, the operation member extends through the slide slot, to be mounted to the connecting portion, the resilient member is sandwiched between the connecting portion and the panel.

3. The electronic device enclosure of claim 2, wherein a position piece extends down from an end edge bounding the slide slot, the resilient member is sandwiched between the position piece and the connecting portion.

4. The electronic device enclosure of claim 2, wherein the connecting portion comprises a shell protruding out from the slide bar and two resilient hooks extending up from the shell, the operation member comprises an operation plate slidably received in the slide slot, two extending pieces extend down from the operation plate, the extending pieces define two latching holes, the hooks are latched into the latching holes of the extending pieces.

5. The electronic device enclosure of claim 4, wherein the connecting portion further comprises a pin extending out from an end of the shell opposite to the slide bar and along the lengthwise direction of the slide bar, the position piece defines a through hole, the resilient member is fitted about the pin, the pin is slidably inserted in the through hole.

6. The electronic device enclosure of claim 2, wherein the latching apparatus further comprises a bracket mounted to a bottom surface of the panel, the bracket comprises a bar-shaped bottom plate, two second side plates extending up from two opposite sides of the bottom plate, and two second end plates extending up from two opposite ends of the bottom plate, wherein the bottom plate, the second side plates, and the second end plates cooperatively bound a receiving space, the latching member is slidably received in the receiving space, one of the second end plates defines a cutout, the latching block is extended through the cutout to latch in the latching hole.

7. The electronic device enclosure of claim 6, wherein an engaging piece extends into the receiving space from the bottom plate adjacent to the cutout, the latching portion further comprises an engaging block protruding out from the slide bar, and stopped by the engaging piece.

8. The electronic device enclosure of claim 2, wherein an indentation is depressed down from the panel adjacent to the first end plate, the indentation extends along a direction perpendicular to the sidewalls, the slide slot is defined in a bottom plate of the indentation extending along an extending direction of the indentation, the operation member is slidably received in the indentation.

9. The electronic device enclosure of claim 1, wherein a distal end of the latching block defines a slanted guiding surface to abut against the corresponding sidewall.

10. An electronic device enclosure, comprising:
a chassis defining a space, and comprising two opposite sidewalls locating at two opposite sides of the space; and
a cover module comprising a cover and a latching apparatus mounted to the cover;
wherein a first end of the cover is rotatably connected to first ends of the sidewalls, and the latching apparatus is mounted to a second end of the cover, second ends of the sidewalls define two latching holes, the latching apparatus comprises two latching members slidably mounted to the cover, two resilient members sandwiched between the latching members and the cover, and two operation members mounted to the latching members, each latching member comprises a latching block, the resilient members bias the latching members to slide, to allow the latching blocks to latch in the latching holes; when the operation members are moved away from each other, deforming the resilient members, until the latching blocks are detached from the latching holes;
wherein two opposite shafts protrude out from the first ends of the sidewalls, the cover comprises a panel detachably covered to the space and two first side plates extending down from two opposite sides of the panel, first ends of the side plates define two opposite cutouts, the shafts are rotatably received in the cutouts; and
wherein the chassis further comprises an end wall connected between the first ends of the sidewalls, and two connecting plates extending out from two ends of the end wall, the shafts protrude out from the connecting plates, the latching hole is located away from the shafts, the cover further comprises a first end plate connected between second ends of the first side plates opposite to the cutouts, the latching apparatus is mounted to the panel adjacent to the first end plate.

11. The electronic device enclosure of claim 10, wherein the panel defines two slide slots adjacent to the first end plate, each slide slot extends along a direction parallel to the first end plate, each latching member comprises a slide bar, a connecting portion formed on a first end of the slide bar and aligning with the slide slot, and a latching portion formed on a second end of the slide bar opposite to the connecting portion, the latching block protrudes out from each latching portion, the operation members extend through the slide slots, to be mounted to the connecting portions, the resilient members are sandwiched between the connecting portions and the panel.

12. The electronic device enclosure of claim 11, wherein a position piece extends down from an end edge bounding each slide slot, each resilient member is sandwiched between the position piece and the corresponding connecting portion.

13. The electronic device enclosure of claim 11, wherein each connecting portion comprises a shell protruding out from the slide bar and two resilient hooks extending up from the shell, each operation member comprises an operation plate slidably received in the corresponding slide slot, two extending pieces extend down from the operation plate, the extending pieces define two latching holes, the hooks are latched into the latching holes of the extending pieces.

14. The electronic device enclosure of claim 13, wherein each connecting portion further comprises a pin extending out from an end of the shell opposite to the slide bar and along the lengthwise direction of the slide bar, each position piece defines a through hole, each resilient member is fitted about the pin, the pin is slidably inserted in the through hole.

15. The electronic device enclosure of claim 11, wherein the latching apparatus further comprises a bracket mounted to a bottom surface of the panel, the bracket comprises a bar-shaped bottom plate, two second side plates extending up from two opposite sides of the bottom plate, and two second end plates extending up from two opposite ends of the bottom plate, the bottom plate, the second side plates, and the second end plates cooperatively bound a receiving space, the latching member is slidably received in the receiving space, the second end plates defines two cutouts, the latching blocks are extended through the cutouts to latch in the latching holes.

16. The electronic device enclosure of claim 11, wherein two indentations are depressed down from the panel adjacent to the first end plate, the indentations extend along a direction perpendicular to the sidewalls, each slide slot is defined in a bottom plate of each indentation extending along an extending direction of the indentation, the operation members are slidably received in the indentations.

* * * * *